United States Patent
Chou

(10) Patent No.: US 8,264,878 B2
(45) Date of Patent: Sep. 11, 2012

(54) METHOD AND APPARATUS FOR INCREASING MEMORY PROGRAMMING EFFICIENCY THROUGH DYNAMIC SWITCHING OF BIT LINES

(75) Inventor: Tsung Yi Chou, Hsinchu County (TW)

(73) Assignee: Macronix International Co., Ltd., Hsinchu (TW)

( * ) Notice: Subject to any disclaimer, the term of this patent is extended or adjusted under 35 U.S.C. 154(b) by 210 days.

(21) Appl. No.: 12/775,427

(22) Filed: May 6, 2010

(65) Prior Publication Data

US 2011/0176361 A1     Jul. 21, 2011

(30) Foreign Application Priority Data

Jan. 18, 2010   (TW) ............................... 99101272 A

(51) Int. Cl.
*G11C 16/04*    (2006.01)

(52) U.S. Cl. .............. 365/185.03; 365/185.18; 365/205; 365/206; 365/207

(58) Field of Classification Search ............. 365/185.03, 365/185.18, 207, 210.12, 205, 206
See application file for complete search history.

(56) References Cited

U.S. PATENT DOCUMENTS

| | | | | |
|---|---|---|---|---|
| 5,732,042 A | * | 3/1998 | Sunaga et al. | 365/230.06 |
| 5,805,507 A | * | 9/1998 | Hull et al. | 365/189.09 |
| 7,031,192 B1 | * | 4/2006 | Park et al. | 365/185.22 |
| 7,215,587 B2 | * | 5/2007 | Lee et al. | 365/200 |
| 7,599,220 B2 | * | 10/2009 | Lin et al. | 365/185.2 |

* cited by examiner

*Primary Examiner* — Pho M Luu

(74) *Attorney, Agent, or Firm* — Stout, Uxa, Buyan & Mullins, LLP

(57) ABSTRACT

A method of efficiently programming charge-trapping memory cells includes sense amplifiers being dynamically connected to cells to be programmed, by switching bit lines. The method increases a number of cells that can be programmed simultaneously, such that an optimal use of sense amplifier resources is obtained.

20 Claims, 8 Drawing Sheets

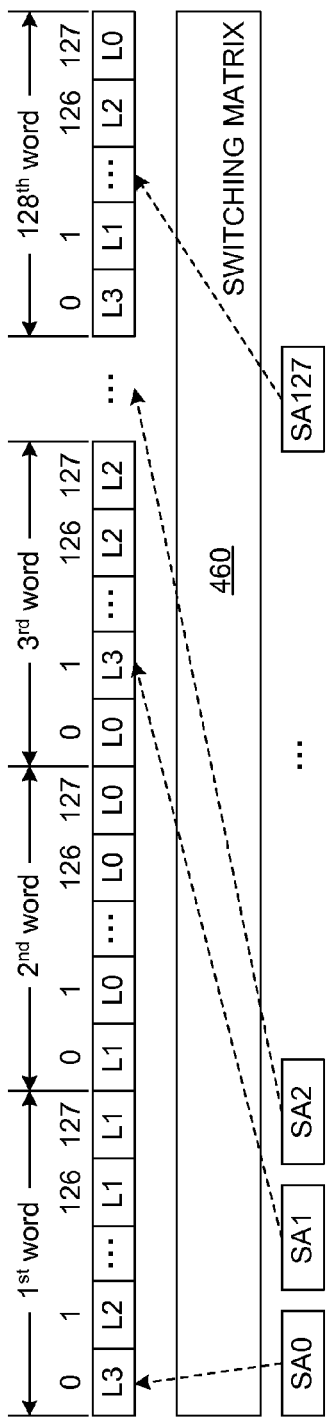
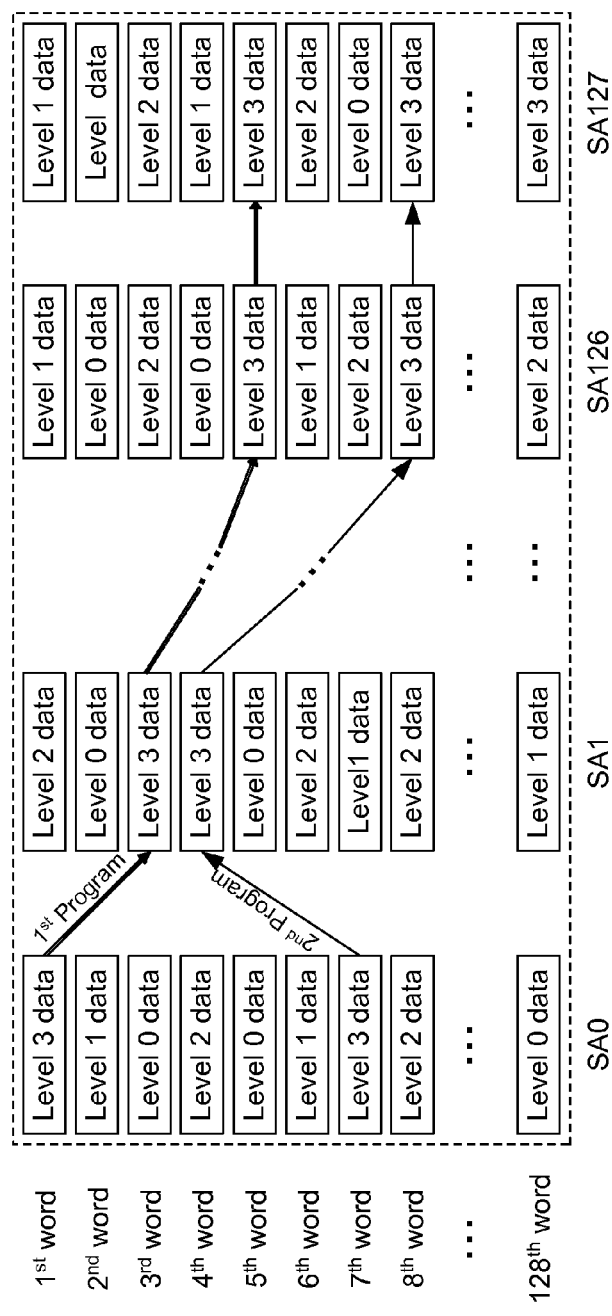
FIG. 8A
FIG. 8B

METHOD AND APPARATUS FOR INCREASING MEMORY PROGRAMMING EFFICIENCY THROUGH DYNAMIC SWITCHING OF BIT LINES

CROSS-REFERENCE TO RELATED APPLICATIONS

The entire contents of Taiwan Patent Application No. 099101272, filed on Jan. 18, 2010, from which this application claims priority, are incorporated herein by reference. This application is related to co-pending U.S. application Ser. No. 12/541,113, filed Aug. 13, 2009, which is commonly assigned and the entire contents of which are hereby incorporated by reference.

BACKGROUND OF THE INVENTION

1. Field of the Invention

The embodiments of the present invention relate generally to semiconductor memories and, more particularly, to methods of programming semiconductor memories.

2. Description of Related Art

Charge-trapping memories, which have been referred to as flash memories, find extensive use in a wide range of electronic devices including cameras, cellular telephones and personal digital assistants as well as modems, laptop computers and the like. Charge-trapping memories are capable of storing relatively large amounts of data in a small space. Data stored in charge-trapping memories maintains its integrity even in the absence of applied power.

A cell of a charge-trapping memory can be programmed by modifying a threshold voltage associated with the cell. Reading data from the cell can be accomplished by applying a reference voltage and detecting a current level. A cell that is programmable to one of two distinguishable threshold levels for storage of one bit of information is commonly called a single-level cell (SLC). When, for example, four or eight distinguishable threshold levels can be supported by the cell, the cell can be capable of storing, respectively, two or three bits of data. A cell that can store more than one bit of data has been referred to as a multi-level cell (MLC).

The time required to program a charge-trapping memory can be relatively large compared to that required simply to read from or erase the memory. In applications involving electronic devices where data is to be stored as rapidly as possible (e.g., in a digital camera), lengthy programming times can reduce efficiency of operation of the memory to the detriment of overall device performance.

A need thus exists in the prior art to reduce the programming time in charge-trapping memories.

SUMMARY OF THE INVENTION

The embodiments of the present invention address this need by, according to an implementation of a method of the invention, providing an array of charge-trapping memory cells (CTMCs) and a plurality of sense amplifiers configured to facilitate programming of the array and receiving data to be programmed into the array. The implementation further may comprise selecting a level to which a first plurality of the memory cells is to be programmed according to the data and then programming a second plurality of the memory cells to the selected level, while utilizing as many as possible of the plurality of sense amplifiers. The array may comprise single-level or multi-level CTMCs, and the entire plurality of sense amplifiers may be utilized.

An embodiment of the present invention may include a memory device comprising an array of CTMCs, a plurality of sense amplifiers configured to facilitate programming of the array, a plurality of bit lines configured to connect the plurality of sense amplifiers to a plurality of the memory cells, and a switching matrix configured to switch bit line connections to maximize utilization of the sense amplifiers in programming. According to another embodiment, the array may comprise a plurality of rows of memory cells, and each of the plurality of rows may comprise a plurality of words, each word comprising a plurality of memory cells.

While the apparatus and method has or will be described for the sake of grammatical fluidity with functional explanations, it is to be expressly understood that the claims, unless expressly formulated under 35 U.S.C. §112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. §112 are to be accorded full statutory equivalents under 35 U.S.C. §112.

Any feature or combination of features described herein are included within the scope of the present invention provided that the features included in any such combination are not mutually inconsistent as will be apparent from the context, this specification, and the knowledge of one skilled in the art. In addition, any feature or combination of features may be specifically excluded from any embodiment of the present invention. For purposes of summarizing the present invention, certain aspects, advantages and novel features of the present invention are described. Of course, it is to be understood that not necessarily all such aspects, advantages or features will be embodied in any particular implementation of the present invention. Additional advantages and aspects of the present invention are apparent in the following detailed description and claims that follow.

BRIEF DESCRIPTION OF THE FIGURES

FIG. 8 is a flow diagram depicting details of a step of the implementation of FIG. 7;

DETAILED DESCRIPTION OF THE PRESENTLY PREFERRED EMBODIMENTS

Figure 1:
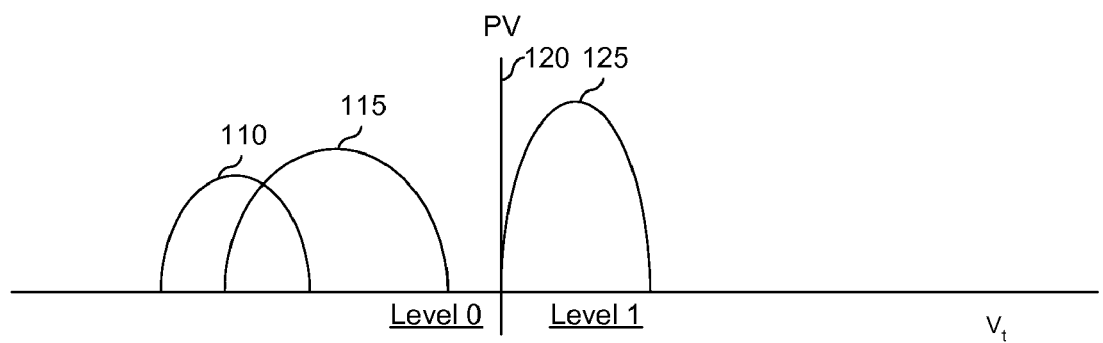
FIG. 1 is a diagram illustrating threshold voltage distributions in a single-level charge-trapping memory cell (CTMC)

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not presumed, automatically, to be to precise scale in all embodiments. That is, they are intended to be examples of implementations of various aspects of the present invention and, according to certain but not all embodiments, to be to-scale. While, according to certain implementations, the structures depicted in these figures are to be interpreted to be to scale, in other implementations the same structures should not. In certain aspects of the invention, use of the same reference designator numbers in the drawings and the following description is intended to refer to similar or analogous, but not necessarily the same, components and elements. According to other aspects, use of the same reference designator numbers in these drawings and the following description is intended to be interpreted as referring to the same or substantially the same, and/or functionally the same, components and elements. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent accompanying this disclosure is to discuss exemplary embodiments with the following detailed description being construed to cover all modifications, alternatives, and equivalents of the embodiments as may fall within the spirit and scope of the invention as defined by the appended claims. It is to be understood and appreciated that the process steps and structures described herein do not cover a complete process flow for the operation of the disclosed structures. The present invention may be practiced in conjunction with various techniques that are conventionally used in the art, and only so much of the commonly practiced steps are included herein as are necessary to provide an understanding of the present invention. The present invention has applicability in the field of semiconductor devices and processes in general. For illustrative purposes, however, the following description pertains to a memory device and a related method.

A charge-trapping memory may be programmed by applying programming voltages to a memory cell in order to generate electrons having sufficient kinetic energy to reach and to become trapped in a portion of a gate of a transistor where they may influence a threshold voltage of the cell. A single-level charge-trapping memory cell (CTMC) may be programmed to one of two programming levels. FIG. 1 is a diagram representing distributions of a threshold voltage $V_t$ in a single-level CTMC. Distributions 110 and 115, having $V_t$ values less than a program verify level PV 120, may be referred to as level 0; distribution 125, having $V_t$ values greater than the program verify level PV 120 may be referred to as level 1. Exemplary values of the program verify level may range from about 3 V to about 5 V.

A single-level CTMC having a level 0 distribution may be described as "unprogrammed" or "erased," whereas a single-level CTMC having a level 1 distribution may be described as "programmed." Stated another way, a single-level CTMC can be in one of two states: programmed and unprogrammed. It should be clear that programming an erased single-level CTMC to level 0 requires no action.

Common practice is to associate a level 0 threshold voltage distribution with a data value of "1," while a data value of "0" may be associated with a level 1 threshold voltage distribution. Programming a single-level CTMC to level 1 may include a step of applying at least one pulse of a programming bias voltage to the cell and then performing a sensing step to determine whether the threshold voltage of the transistor has attained the level of program verify. The process may be repeated until the program verify programming level is reached. A power driver may apply programming voltages, and a sense amplifier (SA) may be employed to perform the sensing step, the SA being bypassed during application of programming voltages. With the understanding that the SAs are employed only in the program verity (i.e., sensing) step of the programming process, SAs will be said to "program" cells in the present description.

CTMCs may be configured as, for example, groups of rows, each row storing 2K-bytes of data. Each row of such a CTMC device may comprise 2×1024=2048 bytes or 2048× 8=16,384 bits according to one exemplary embodiment. According to another embodiment, an array of CTMCs is configured in 8K-byte rows, each row comprising four 2K-byte program groups. A 2K-byte program group of a CTMC device (comprising, for example, one fourth of an 8K-byte row) may be considered as 128 groups of 128-bit "words." That is, one 8K-byte row may comprise four 2K-byte program groups, each of which comprises 128 words with each word comprising 128 cells with each cell in the CTMC row storing one data bit.

Programming a single-level CTMC device using prior-art methods may comprise selecting a row, selecting a program group within the row, and selecting a word within the program group. A portion of a group of 128 SAs may then be activated according to a 128-bit pattern that is to be written into the selected word. That is, for bits in the word that are to be programmed (i.e., set to data "0"), bit lines connected to corresponding positions in the selected word may have programming voltages applied by corresponding program drivers in order to accomplish programming of the selected word.

Figure 2:
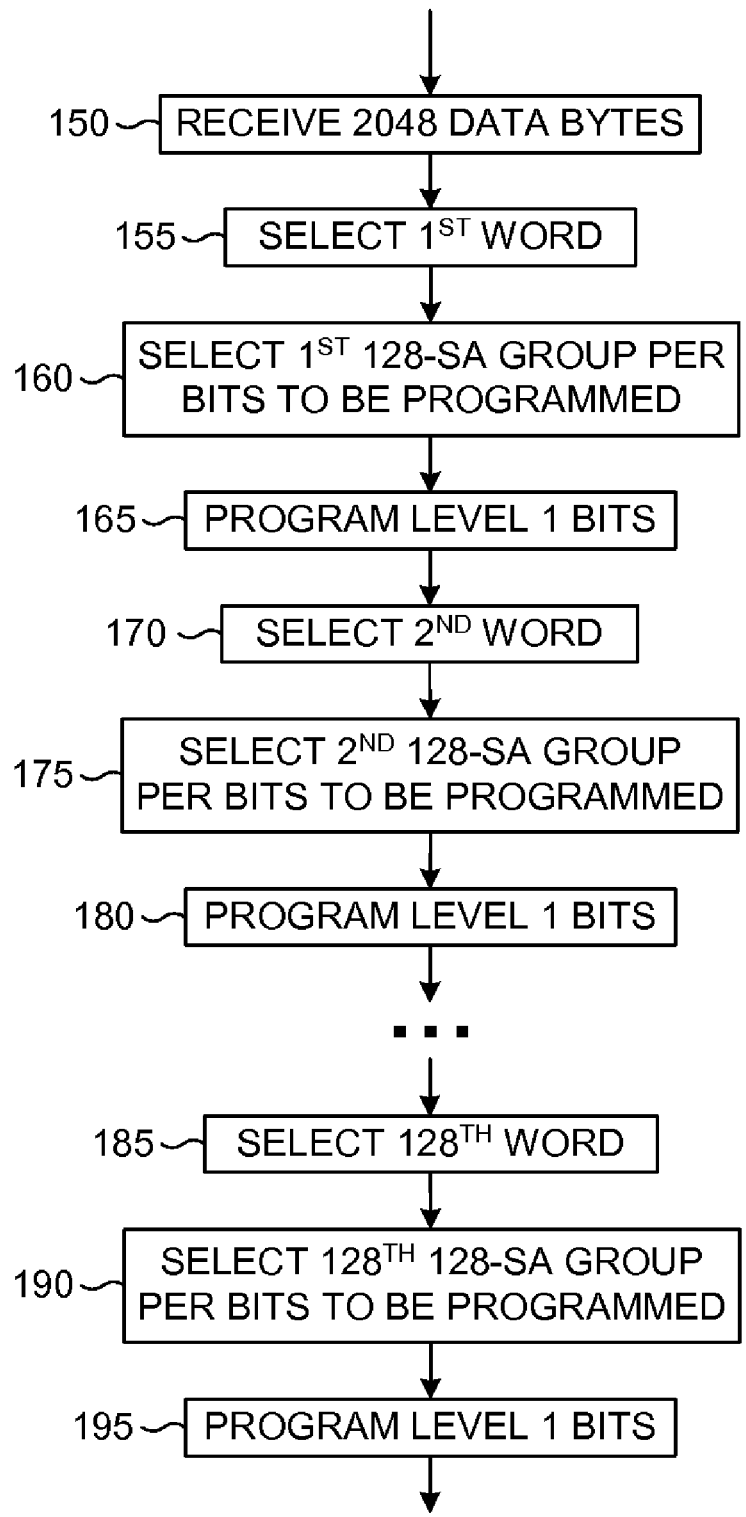
FIG. 2 is a flow diagram describing a prior-art method of programming a single-level CTMC.

FIG. 2 is a flow diagram that depicts the prior-art method of programming single-level CTMCs as just described. At step 150 2K bytes of data are received that are to be programmed into a 2K-byte block (e.g., one row or one program group) of a CTMC array. The data bytes are arranged sequentially with an understanding that the first 128 bits are to be programmed into a first word of the row, the second 128 bits are to be programmed into a second word of the row, and so on. The method proceeds by selecting the first word in the array at step 155. At step 160, a portion of a group of 128 SAs is selected, each selected SA being connected by a bit line to a cell to be programmed in the selected word. The data of the first 128 received bits are used to activate each of the 128 SAs that corresponds to a data value of "0" in the first 128 received bits in order to program the corresponding CTMCs in the first word to level 1 at step 165.

The second word in the row is selected at step 170, and each of the 128 SAs corresponding to a data value of "0" in the second 128 received bits is selected and activated at step 175. The activation of SAs is configured to program the CTMCs in the second word corresponding to a data value of "0" to level 1 at step 180. The process continues until the $128^{th}$ (last) word is selected at step 185, the appropriate SAs are activated at step 190 according to "0" data bits, and the $128^{th}$ word is programmed at step 195.

It should be clear that, even if programming is successful on the first attempt in every case, a number of programming cycles required to program the array must be at least 128 when the prior art method of FIG. 2 is used, regardless of how many cells actually require programming. (As used herein, a programming "cycle" refers to a programming step that programs at least one cell in a word.) That is, even if, for example, 127 of the 128 bits of each word were not to be programmed, which is to say that even if only one "0" bit in each word were to be programmed, a total of 128 programming cycles would be required at a minimum to program the block or array. Moreover, if data to be programmed are randomly distributed, it should be expected that about half of the data are "0" and half are "1." Therefore, with 128 SAs being dedicated to each programming cycle, about half of them are not used, being associated with a data value of "1" that requires no programming. A programming efficiency for single-level CTMCs using the prior art method of FIG. 2 is therefore expected to be about 50%.

Similar considerations apply to programming a multi-level CTMC. As an example, a multi-level CTMC may be programmable to one of three levels as illustrated diagrammatically in FIG. 3. As before, a level 0 threshold voltage distribution 200 or 205 may correspond to an unprogrammed multi-level CTMC and may be associated, for example, with a pair of binary data values, "11." In the four-level example illustrated in FIG. 3, a level 1 distribution 215, which may correspond to a pair of binary data values "01," may have threshold voltage values $V_t$ greater than a first program verify level PV1 210 but less than a second program verify level PV2 220. Similarly, level 2 threshold voltage values 225, which may correspond, for example, to a pair of binary data values "00," may be distributed over a range greater than the second program verify level PV2 220 but less than a third program verify level PV3 230. Level 3 threshold voltage values 235 may be distributed over a range greater than PV3 230 and may correspond to a pair of data values "10."

Figure 4:
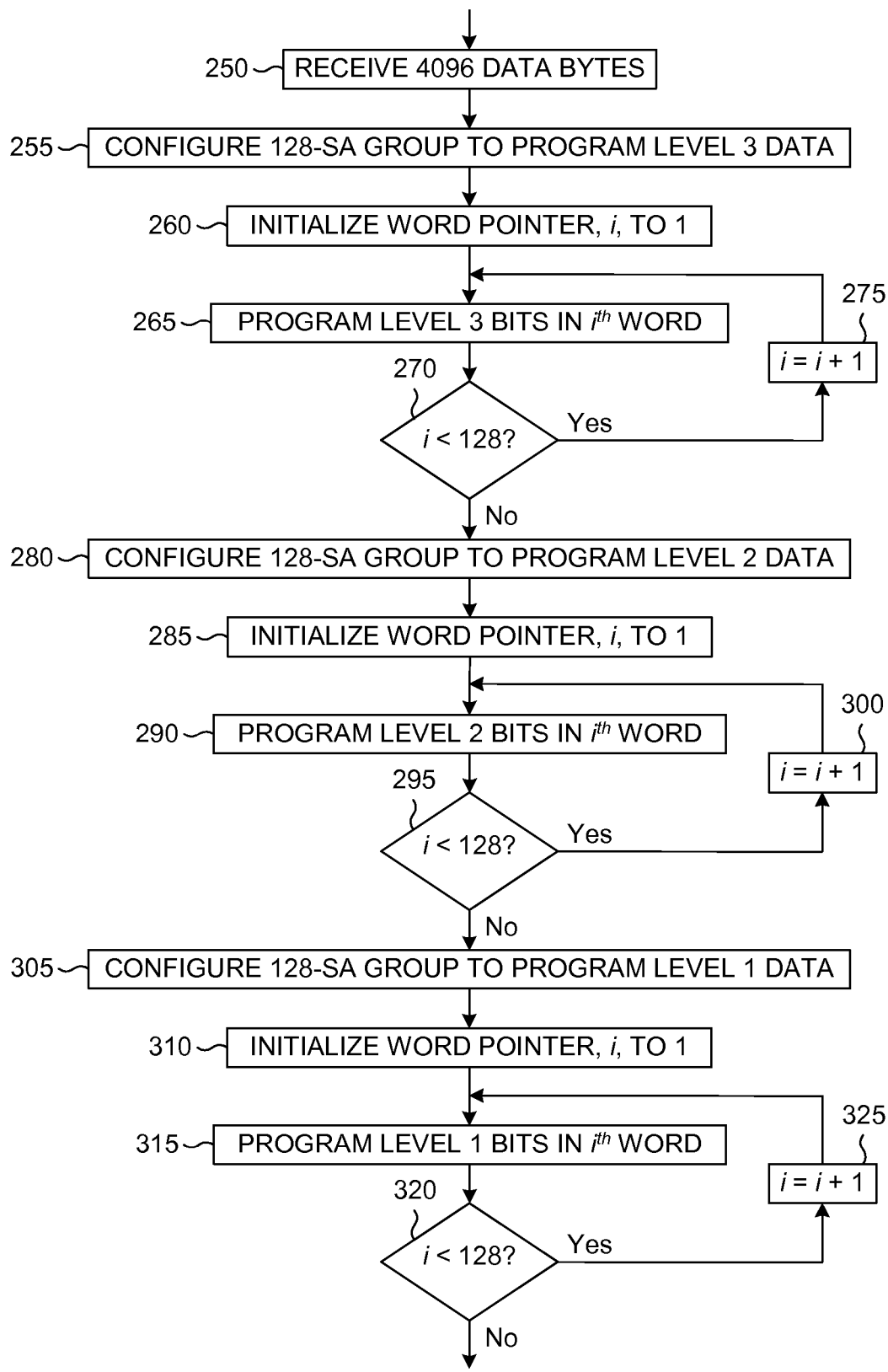
FIG. 4 is a flow diagram illustrating a prior-art method of programming an array of multi-level CTMCs.

FIG. 4 is a flow diagram illustrating an example of a prior-art method of programming a multi-level CTMC array. In a manner similar to that described above with reference to FIG. 2, 4096 bytes of data, corresponding to 4096×8=32,768 data bits, are received at step 250. As already suggested, the data values may be associated with one of four programming levels, namely, level 0, level 1, level 2 and level 3, where level 0 corresponds to a threshold voltage distribution of an unprogrammed or erased multi-level CTMC. Each CTMC, therefore, can store two bits of data so that 32,768/2=16,384 (i.e., 16 K) 4-level CTMCs suffice to store the 4096 data bytes. The CTMC array may be organized into rows with each row comprising, according to one embodiment, 16,384 cells. Such a row of CTMCs may be visualized as 128 words, each word comprising 128 CTMCs with each CTMC storing two bits of data.

The programming is accomplished in this example with 128 SAs adapted to program individual words selected sequentially by activating bit lines corresponding to words or portions of rows in a selected row of the CTMC array. Programming data values "11" corresponding to level 0 requires no action. To program the level 1, level 2 and level 3 data, the prior-art method depicted in FIG. 4 configures the 128 sense amplifiers to program level 3 data at step 255 and initializes a word counter, i, to one (1) at step 260. The $i^{th}$ word is selected, a portion of the bits of which may have values of "10," which can be associated with programming corresponding multi-level CTMCs to level 3. Accordingly, at step 265, those of the 128 SAs that correspond to level 3 data are addressed, and the corresponding positions in the $i^{th}$ word are programmed to level 3. At step 270, the value of i is compared with 128, and if i<128, then i is incremented at step 275, and the "01" bits of the next word are programmed to level 3 at step 265. The 265/270/275 loop is repeated until the level 3 bits of all 128 words have been programmed, and the method continues at steps 280, 285, 290, 295, and 300 to program the "00" bits of the 128-word group to level 2 using a procedure similar to that employed for the level 3 bits. Similarly, the level 1 bits "10" of the 128-word group are programmed at steps 305, 310, 315, 320, and 325.

An observation similar to that made above relative to programming single-level CTMCs can be made regarding the prior-art method of programming 4-level CTMCs as summarized in FIG. 4. Even if each group of 128 data values contained only one level 3, one level 2, and one level 1 value to be programmed, a total of 128 steps would be required to program 128 words to just one of three program levels, a total of at least 3×128=384 program steps. Moreover, when data are randomly distributed, about one fourth of the cells in each word can be expected to correspond to each of the four required programming levels. On any one programming cycle, therefore, only one fourth of the SAs are involved, on average, in the programming when using the prior-art method of FIG. 4. In this sense, the efficiency of this prior-art method of programming is therefore about 25%.

Figure 5A:
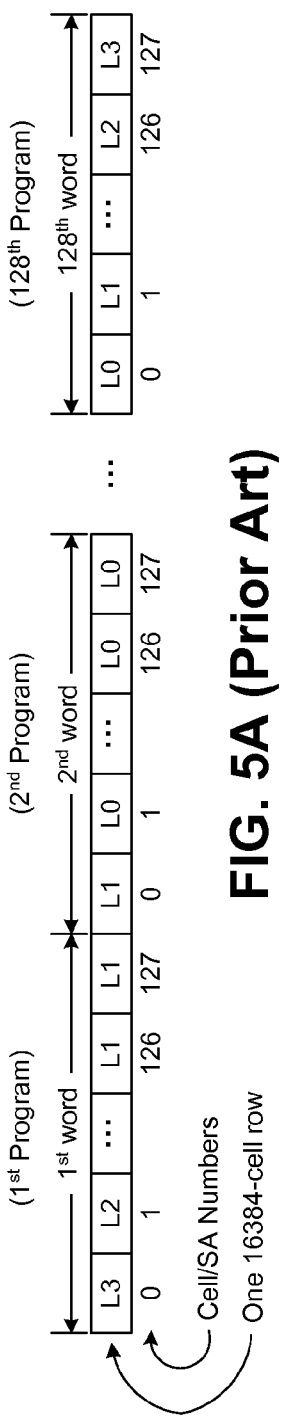
FIG. 5 is a chart illustrating a prior-art method of programming an array of multi-level CTMCs.

FIG. 5A is a pictorial diagram depicting one 4K-byte (i.e., 32,768-bit) program group of a 4-level CTMC array to be programmed using the prior-art method of FIG. 4. The program group, which may comprise a portion of a longer physical row in the array containing, for example, 16,384 cells, is depicted in the figure as 128 words with each word comprising 128 cells and each cell storing two bits of data. A first word in the program group includes cells numbered 0, 1, . . . , 127 wherein cells 0, 1, . . . , 126 and 127 are to be programmed to, respectively, level 3, level 2, . . . , level 1 and level 1. A second word in the program group includes cells that, likewise, are numbered from 0 to 127 with cells 0 and 1 programmed to, respectively, level 1 and level 0 and with both cells 126 and 127 programmed to level 0. Continuing in a similar manner, cells 0, 1, . . . , 126 and 127 in the last ($128^{th}$) word are to be programmed to respective levels 0, 1, . . . , 2, and 3.

Figure 5B:
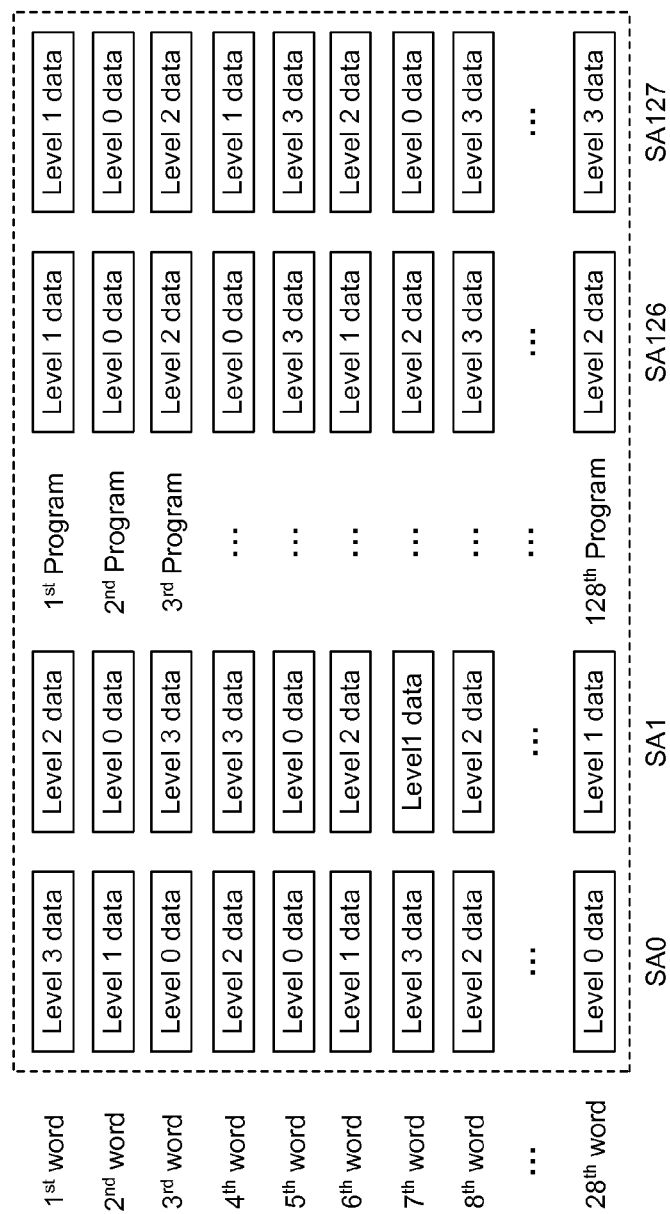

An alternative view of the program group of FIG. 5A is presented in FIG. 5B wherein each word in the program group is represented diagrammatically as a virtual row in a 128×128 virtual array of 4-level cells. When the prior-art method of FIG. 4 is used to program the group, the first word is selected, and any level 3 data in the word is programmed. Then word 2, word 3, . . . , word 128 may be selected in turn with level 3 cells in each word programmed for each word. Subsequently, word 1 may be selected, and level 2 cells may be programmed followed by programming level 2 cells in words 2, 3, . . . 128. Finally, level 1 cells may be programmed in the same sequence. The prior-art programming method, again, is noted to require 3×128=384 programming cycles to complete programming of the 4K-byte programming group when 128 SAs are used.

Figure 6:
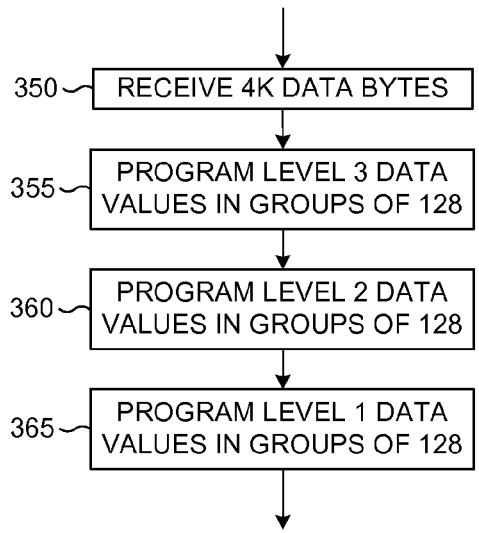
FIG. 6 is a chart illustrating an implementation of a method of programming an array of multi-level CTMCs according to the present invention.

FIG. 6 is a flow diagram describing in broad terms an implementation of an efficient programming procedure according to the present invention. According to the illustrated implementation, a set of 4096 data bytes is received at step 350 for programming into a 4-level CTMC array of 16,384 cells arranged in 128×128 form as described above relative to FIGS. 5A and 5B. At step 355, only the level 3 data in the set are selected, and the level 3 data is programmed simultaneously by dynamically allocating bit lines to the 128 SAs utilizing any SA corresponding to, for example, a column of the virtual array of FIG. 5B having a cell to be programmed to level 3. Typically, therefore, 128 cells are programmed to level 3 on the first programming pass. Cells continue to be programmed in groups of 128 until all level 3 cells in the program group have been programmed. The process then continues at step 360 for programming level 2 data using the same method employed to program the level 3 cells, and a similar process is performed for level 1 data at step 365. It will be seen that the implementation summarized in FIG. 6 makes efficient use of available SAs and may improve the efficiency of programming of arrays of CTMCs when compared with, for example, the prior-art method of FIG. 4.

Figure 3:
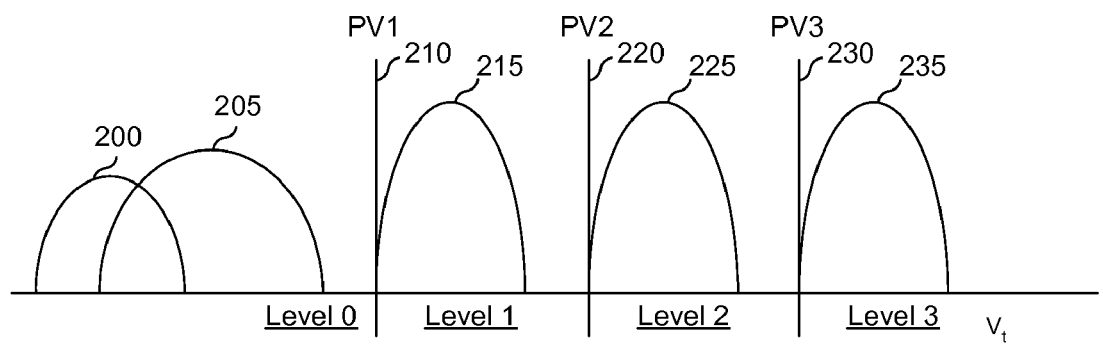
FIG. 3 is a pictorial diagram depicting threshold voltage distributions in a multi-level CTMC.
Figure 7:
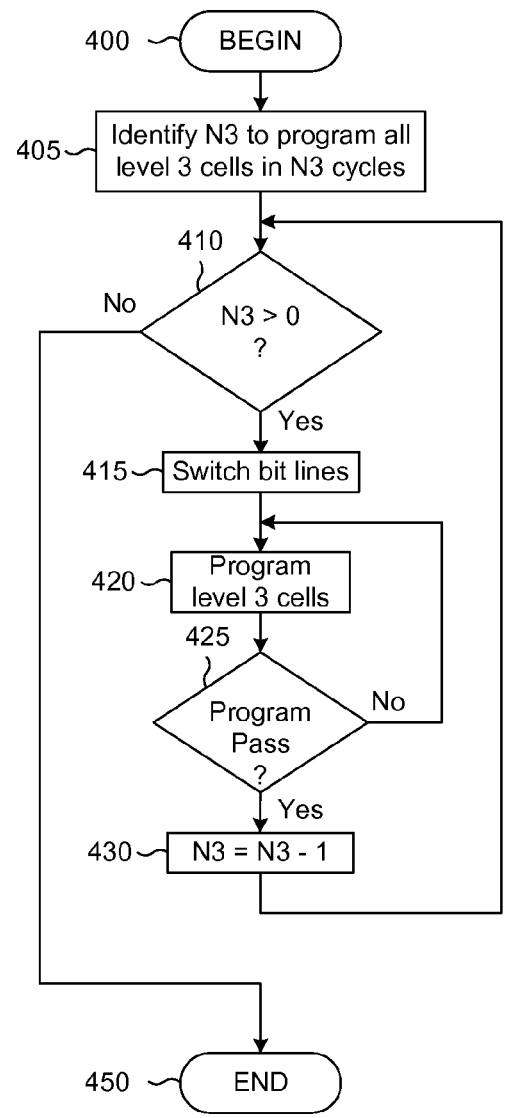
FIG. 7 is a flow diagram summarizing an implementation of a method of programming an array of multi-level CTMCs according to the present invention.

FIG. 7 is a flow diagram that describes details of step 355 in the implementation of FIG. 6 for each SA. The details may begin at step 400 and may continue at step 405 by determining, for each SAj, j=0, 1, . . . 127, a number, Nj, of level 3 cells to be programmed by the corresponding SA, SAj according to the received set of 4096 data bytes. A number N3 is chosen as the largest of the $\{N_j\}$. That is, N3 is the number of level 3 data to be programmed by the one or more SAs corresponding to columns of the arrangement of FIG. 5B that contain the largest number of level 3 data cells. At step 410 N3 is compared with 0, and if N3 is greater than 0, meaning at least one cell is to be programmed to level 3, then bit lines are switched at step 415 according to the next level 3 cell, if any, to be programmed by each SA. The cells selected at step 415 are then programmed at step 420 utilizing every one of the 128 SAs having at least one level 3 cell to be programmed. The programming at step 420 may be repeated as necessary according to a result of a program verify test performed at step 425 that checks whether the threshold level of the programmed cells exceeds, for example, the PV3 level 230 (FIG. 3). N3 may be decremented by 1 at step 430, and the process may repeat from step 410 until N3 no longer exceeds 0, meaning that all level 3 cells have been programmed. When finished, the implementation may end at step 450.

Steps 360 and 365 of FIG. 6 may be performed for level 2 and level 1 in a manner similar to that illustrated for level 3 in FIG. 7.

FIG. 8A is a pictorial diagram depicting the same 16,384-cell program group of 4-level CTMCs as are shown in FIG. 5A. The array is enhanced by adding a switching matrix 460 which is adapted to connect each SA to its corresponding cell in any of the 128 words that form the program group. Connections among some of the SAs and cells of the array are depicted in the diagram according to a first programming cycle, i.e., first execution of steps 415 and 420 in FIG. 7. For example, SA0 is connected to (i.e., configured to program) cell 0 in the first word to level 3. Similarly, SA1 is configured to program cell 1 in the $3^{rd}$ word to level 3 and so on. In general, each SA may be configured to program a level 3 cell in some word of the physical row, which may maximize utilization of the SAs.

FIG. 8A is redrawn in FIG. 8B with each word in the physical row of FIG. 8A depicted as a virtual row in a 128× 128 virtual array of cells. On a first programming cycle, the switching of the bit lines referred to at step 415 of FIG. 7 causes, for example, the zeroth cell in the first word, the first cell in the third word, the $126^{th}$ cell in the fifth word and the $127^{th}$ cell in the eighth word to be programmed to level 3. After switching bit lines, a second programming cycle programs the zeroth cell in the seventh word, the first cell in the fourth word, the $126^{th}$ cell in the eighth word and the $127^{th}$ cell in the eighth word to level 3. The process may continue until all level 3 cells have been programmed for each SA. It will be noted that the number of cycles (i.e., N3 in FIG. 7) required to complete the level 3 programming is the maximum number of level 3 cells that appear in any column of the diagram in FIG. 8B. Programming of level 2 and level 1 cells may proceed in a similar manner.

Figure 9:
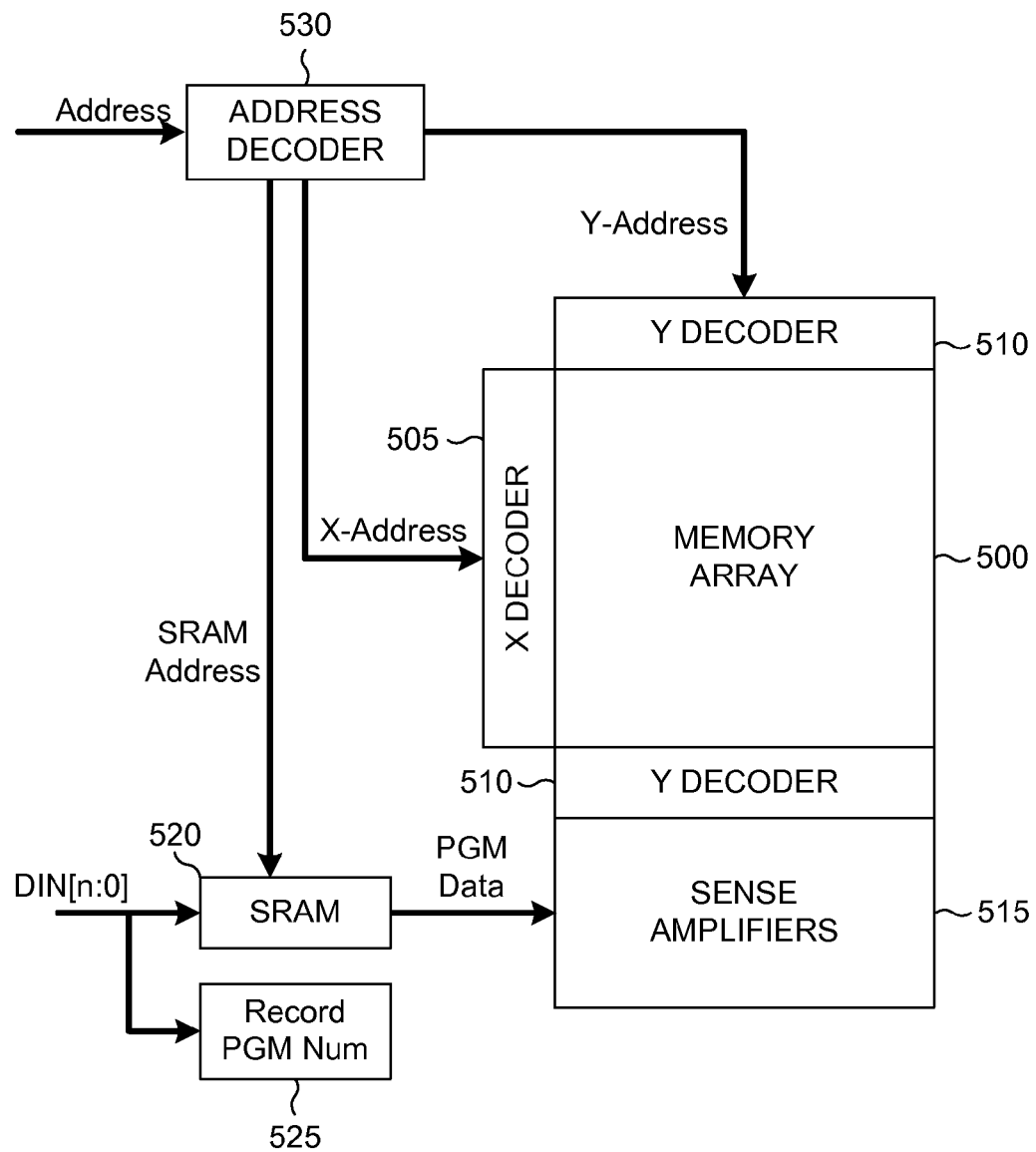
FIG. 9 is a block diagram of an embodiment of an apparatus adapted to program a single- or multi-level CTMC array according to the present invention.

FIG. 9 is a block diagram of an embodiment of an apparatus adapted to program a single- or multi-level CTMC array according to the present invention. The embodiment comprises a memory array 500, which may be an array of CTMC memory cells, an X-decoder 505 adapted to select a row of the array, a Y-decoder 510 adapted to select bit lines for programming and reading, and static random access memory (SRAM) 520 that may provide temporary storage for input data DIN [n:0] during programming. In DIN[n:0], "n" may represent a bit number of a program unit (e.g., the 128-word program unit in FIG. 8A). The embodiment also comprises a "Record PGM Num" block 525, which may store a number of words to be programmed to level 3, level 2, and level 1 for each SA in each DIN[n:0] block, as well as an address decoder 530. The address decoder 530 may receive an address and may resolve the received address into an X-address, a Y-address and an SRAM address, which are communicated to, respectively, the X-decoder 505, the Y-decoder 510, and the SRAM 520. That is, because programmed data DIN[n:0] moves with program address, a bit line to be decoded is known from the data. A bit line may be switched on for programming according to an SRAM address generated by the address decoder 530. A collection of sense amplifiers 515 included in the embodiment is adapted to program verify and/or read data into/from the memory array 500.

According to one embodiment, the Y-decoder comprises a biased bit line decoder YS and a grounded Y-decoder YG (not shown in FIG. 9). As already described, SAs are used in a verify procedure during programming and may be bypassed during application of high programming voltages. The Y-decoder 510 may be configured to provide communication between each SA and a corresponding cell (according to the SA) in a selected word according to the method summarized above with reference to FIGS. 6 and 7.

Figure 10:
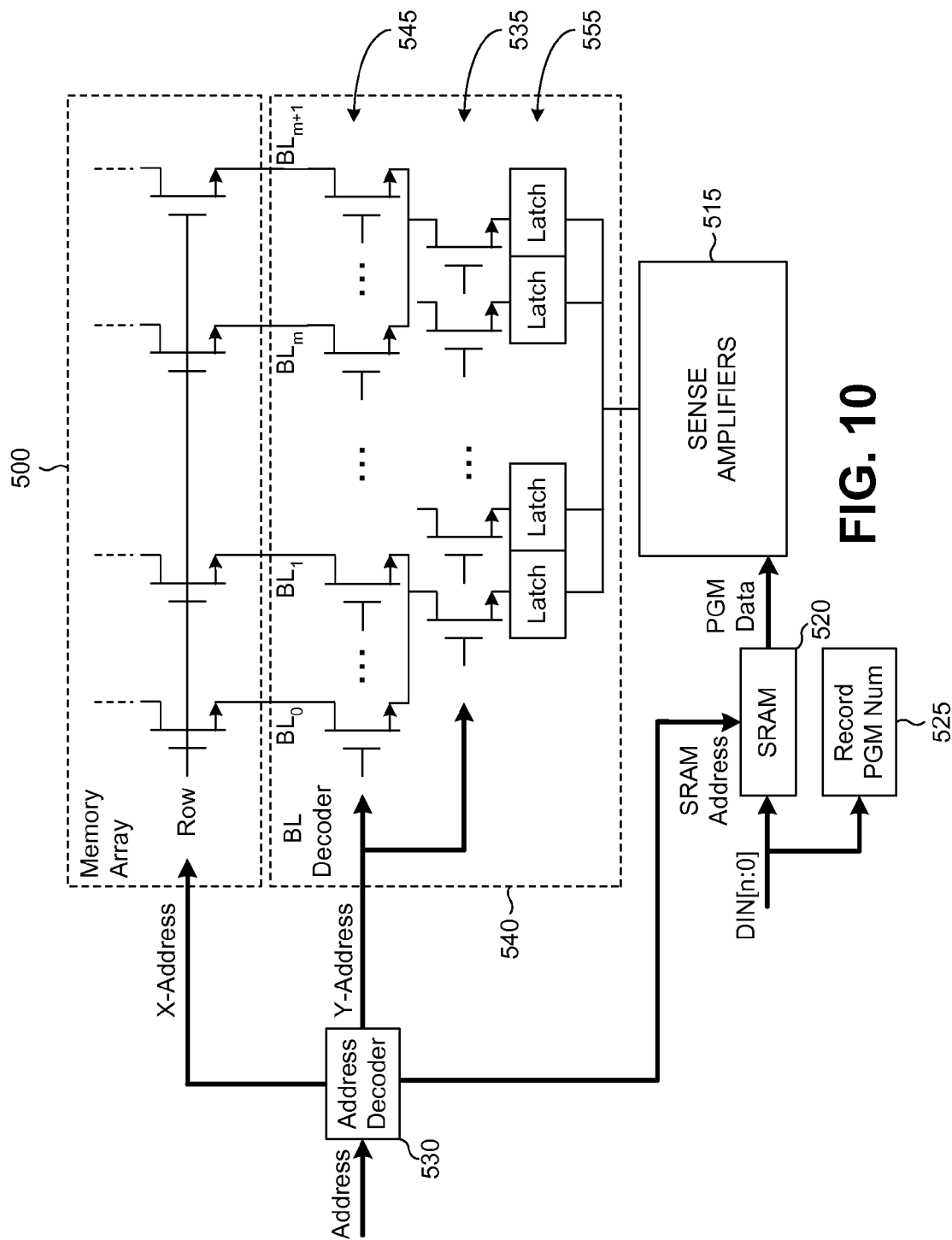
FIG. 10 is a simplified schematic diagram of an alternative embodiment of an apparatus that may be used to program a single- or multi-level CTMC array according to the present invention.

FIG. 10 includes further details on the embodiment shown in FIG. 9. The embodiment, as illustrated, comprises the address decoder 530, which may receive a memory address and present an X-address to the memory array 500 that may select a physical row of the array. The address decoder 530, further, may present a Y-address to a bit line decoder 540 comprising a word decoder 535 and a bit decoder 545. The word decoder 535 may select a word to be programmed, and the bit decoder 545 may select a cell to be programmed within the selected word. Latch circuits 555 may switch different words' bit lines to a particular SA during a program operation. For example, in FIG. 8A, SA0 is switched to the first word during the first level 3 programming operation and is switched to the seventh word (cf. FIG. 8B) during a second level 3 programming step.

It should be clear that the implementations of methods and embodiment(s) of apparatus herein described can reduce average time required to program CTMC arrays. Referring to FIGS. 5A and 5B, and considering one illustrative example, suppose that SA8 is the SA with the largest number (e.g., 50) of cells to be programmed according to level 3 data. Suppose further that SA79 has the largest number (e.g., 45) of cells to be programmed to level 2 and that SA101 has the largest number (e.g., 51) of cells to be programmed to level 1. When the prior-art method illustrated in FIG. 4 is used, 128 program cycles are required to program the level 3 cells in each of the 128 rows in the array. Similarly, 128 program cycles are required to program each of the level 2 cells and the level 1 cells. The total number of program cycles is, at a minimum, 384. This is true, even if each cell is successfully programmed in only one cycle. Programming according to the present invention, however, requires 50 program cycles to complete the level 3 programming, 45 cycles to perform the level 2 programming and 51 cycles to complete the level 1 programming. The total number of program cycles according to the present invention is 146, which, when compared with the 384 cycles required using the prior-art method of FIG. 4, represents a significant improvement in programming efficiency.

In view of the foregoing, it will be understood by those skilled in the art that the methods and apparatus of the present invention can facilitate programming of memory devices exhibiting single- and multi-level structures, in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method, comprising:
providing an array of charge-trapping memory cells (CTMCs) and a plurality of sense amplifiers configured to facilitate programming of the array;
receiving data to be programmed into the array;
selecting a level to which a first plurality of the memory cells is to be programmed according to the data; and
programming a second plurality of the memory cells to the selected level utilizing as many as possible of the plurality of sense amplifiers when the number of the second plurality of the memory cells is greater than the number of the plurality of sense amplifiers.

2. The method as set forth in claim 1, wherein the providing of an array comprises providing an array of multi-level CTMCs.

3. The method as set forth in claim 2, wherein the providing of an array of multi-level CTMCs comprises providing an array of four-level CTMCs.

4. The method as set forth in claim 1, wherein the utilizing comprises employing the entire plurality of sense amplifiers.

5. The method as set forth in claim 1, further comprising:
providing bit lines configured to connect the plurality of sense amplifiers to a plurality of the memory cells; and
switching bit line connections to maximize utilization of sense amplifiers.

6. The method as set forth in claim 5, wherein the switching comprises:
configuring the utilized sense amplifiers for programming of cells to the selected level; and
connecting the utilized sense amplifiers to the second plurality of memory cells.

7. The method as set forth in claim 6, further comprising providing the array in rows, each row comprising a plurality of words, and each word comprising a plurality of cells, the plurality of sense amplifiers corresponding to the plurality of cells.

8. The method as set forth in claim 7, wherein the switching permits connection of the plurality of sense amplifiers to the plurality of cells irrespective of words in which cells are located.

9. A memory device comprising:
an array of charge-trapping memory cells (CTMCs);
a plurality of sense amplifiers coupled to facilitate programming of the array;
a plurality of bit lines arranged to connect the plurality of sense amplifiers to a plurality of the memory cells; and
a switching matrix configured to switch bit line connections to utilize all of the plurality of sense amplifiers in programming when a number of memory cells to be programmed is greater than the size of all of the plurality of sense amplifiers.

10. The memory device as set forth in claim 9, wherein the array comprises multi-level CTMCs.

11. The memory device as set forth in claim 10, wherein the array comprises four-level CTMCs.

12. The memory device as set forth in claim 9, wherein:
the array comprises a plurality of rows of memory cells; and
each of the plurality of rows comprises a plurality of words, each word comprising a plurality of memory cells.

13. The memory device as set forth in claim 12, further comprising an address decoder configured to receive an address and to select a row in the array according to the address.

14. The memory device as set forth in claim 13, wherein the address decoder is further configured to select a word in the selected row according to the address.

15. The memory device as set forth in claim 12, wherein:
the plurality of sense amplifiers comprises at least 128 sense amplifiers; and
the plurality of memory cells in each word comprises at least 128 memory cells.

16. The memory device as set forth in claim 12, wherein each of the plurality of rows comprises at least 128 words.

17. A method, comprising:
receiving multi-level data to be programmed into an array of CTMCs, the array comprising a plurality of bit lines adapted to address memory cells in the array, a plurality of sense amplifiers adapted to facilitate programming of memory cells, and a switching matrix adapted to connect the plurality of sense amplifiers to a plurality of memory cells;
selecting a programming level;
counting a number of cells to be programmed to the selected programming level; and
programming cells to the selected programming level according to a size of the plurality of sense amplifiers.

18. The method as set forth in claim 17, further comprising programming cells to the selected programming level utilizing all of the plurality of sense amplifiers when the number of cells to be programmed is greater than the size of the plurality of sense amplifiers.

19. The method as set forth in claim 18, further comprising:
reducing the number of cells to be programmed by the size of the plurality of sense amplifiers after programming when the number of cells to be programmed is greater than the size of the plurality of sense amplifiers, thereby determining a remaining number of cells to be programmed; and
programming the remaining number of cells to be programmed utilizing a sense amplifier for each cell when the remaining number of cells is less than the size of the plurality of sense amplifiers.

20. The method as set forth in claim 17, wherein the receiving comprises receiving four-level data.

* * * * *